United States Patent [19]
Intrater

[11] Patent Number: 5,818,251
[45] Date of Patent: Oct. 6, 1998

[54] APPARATUS AND METHOD FOR TESTING THE CONNECTIONS BETWEEN AN INTEGRATED CIRCUIT AND A PRINTED CIRCUIT BOARD

[75] Inventor: Amos Intrater, Netanya, Israel

[73] Assignee: National Semiconductor Corporation, Santa Clara, Calif.

[21] Appl. No.: 661,455

[22] Filed: Jun. 11, 1996

[51] Int. Cl.$^6$ .................................................. G01R 31/26
[52] U.S. Cl. ...................... 324/765; 324/538; 324/73.1; 327/594; 257/48
[58] Field of Search ................................... 324/765, 537, 324/538, 73.1; 327/520, 594; 257/48, 146

[56] References Cited

U.S. PATENT DOCUMENTS

| | | | |
|---|---|---|---|
| 4,035,826 | 7/1977 | Morton et al. | 357/42 |
| 4,779,041 | 10/1988 | Williamson, Jr. | 324/537 |
| 4,779,043 | 10/1988 | Williamson, Jr. | 324/537 |
| 4,817,012 | 3/1989 | Cali | 364/488 |
| 4,853,628 | 8/1989 | Gouldsberry et al. | 324/763 |
| 4,963,824 | 10/1990 | Hsieh et al. | 324/763 |
| 4,998,250 | 3/1991 | Kohlmeier et al. | 371/15.1 |
| 5,101,152 | 3/1992 | Harwood et al. | 340/653 |
| 5,103,166 | 4/1992 | Jeon et al. | 324/73.1 |
| 5,280,237 | 1/1994 | Buks | 324/765 |
| 5,371,457 | 12/1994 | Lipp | 324/158.1 |
| 5,498,964 | 3/1996 | Kerschner et al. | 324/530 |
| 5,659,257 | 8/1997 | Lu et al. | 324/963 |
| 5,670,890 | 9/1997 | Colwell et al. | 324/765 |

*Primary Examiner*—Glenn W. Brown
*Attorney, Agent, or Firm*—Limbach & Limbach L.L.P.

[57] ABSTRACT

Apparatus and method for testing the connection (i.e. solder joint) between an input/output (I/O) pin of an integrated circuit and a conductive trace of a printed circuit board (PCB). The internal circuitry of the integrated circuit is isolated from each I/O pin, and a first voltage source is coupled to each I/O pin via a respective pull-up load resistor. A tester circuit is coupled to each conductive trace of the PCB and compares the voltage $V_T$ thereon with a high threshold level (HTVL) and a low threshold level (LTVL) to test for a proper connection. Voltage $V_T$ is derived for an I/O pin under test when a resistive element, which is part of the tester circuit, is operatively coupled between the corresponding conductive trace and a second voltage source. If $V_T$ is below the LTVL or above the HTVL, the I/O pin is improperly coupled to the conductive trace. If $V_T$ is between the LTVL and HTVL, then the voltage on each of the other traces is compared to the HTVL. If the voltage level of one of the other traces not under test is below the HTVL, then the other I/O pin is electrically shorted to the I/O pin under test.

6 Claims, 7 Drawing Sheets

APPARATUS AND METHOD FOR TESTING THE CONNECTIONS BETWEEN AN INTEGRATED CIRCUIT AND A PRINTED CIRCUIT BOARD

BACKGROUND OF THE INVENTION

1. Field of the Invention

The present invention relates to testing electronic circuits, and more particularly to testing electrical connections between terminal pins (i.e., input/output pins) of an integrated circuit and corresponding traces (i.e., conductive runners) of a printed circuit board.

2. Description of the Related Art

Electronic circuits typically include semiconductor integrated circuits (ICs) mounted on a printed circuit board (PCB). It is important in manufacturing the electronic circuits that the terminal pins of each IC be properly soldered to the corresponding traces of the PCB. Otherwise, the electronic circuit may not perform its intended function. If the IC is not properly coupled to the PCB, open circuits may result whereby individual terminal pins of the IC do not properly electrically contact the PCB traces, or short circuits may result whereby at least two IC terminal pins are shorted together. These defects can routinely occur with ICs having numerous terminal pins and a fine pitch (i.e., spaced close together).

In order to ensure that each electronic circuit performs its intended function, electronic circuit manufacturing companies typically employ quality control specialists. Quality control of manufacturing and production usually requires implementation of systems for testing electronic components such as ICs after they have been soldered onto the PCB. Systems for testing electronic circuits are typically classified into four categories, namely functional testers, in-circuit testers, manufacturing defect analyzers and built-in self-test programs.

"Functional testers" comprise devices which measure the output performance of an electronic circuit based on the application of a known predetermined input signal. Although functional testers provide an excellent way of testing whether the output signal of a particular electronic circuit is proper, they are usually incapable of identifying the location of a defect in the electronic circuit with specificity (e.g., is the defect in the PCB itself or within a component mounted on the board). As PCBs become larger and more complex (e.g., due to the many traces and ICs on the board), the likelihood of a defect occurring on a board or within one of the many components mounted thereon increases. Since functional testers merely indicate whether or not the electronic circuit is providing a proper output signal, but do not locate the defect with particularity so that it can be fixed, the usefulness of functional testers as an overall testing system is limited because a defective electronic circuit can only be discarded.

One very important potential problem that should be tested in every electronic circuit is whether all of the terminal pins of each component are in fact properly soldered to corresponding traces of the circuit board. Functional testing may not detect every error if the functions performed by a particular IC and provided by a specific terminal pin are not thoroughly tested. Functional testing is particularly difficult when the circuitry inside each component is unknown, such as with application specific integrated circuits (ASICs). Because of the large number of ASICs in use today and the complexity of the functions performed by these devices, it is often not feasible to design a functional test to properly examine every ASIC contained within the electronic circuit.

Because of the limitations of functional testers, "in circuit testing" techniques have been developed. In circuit testing examines the individual components of the electronic circuit to determine if each is operating properly. In this manner, non-functioning components can be readily identified and repaired or replaced. Since each defective component can be identified, the entire electronic circuit need not be discarded when a defect is detected. This process works well for simple components where the circuitry inside the component is known and can be easily tested. However, if the component being tested is complex, or if the circuitry inside the component is unknown, in circuit testing may not achieve completely satisfactory results. While in circuit testing can identify which electrical component is not functioning properly, it is incapable of determining if the solder joint which couples the terminal pin of the electronic component to the PCB need only be resoldered.

"Manufacturing defect analyzers" were originally developed as inexpensive devices for testing simple defects such as open circuits or short circuits on the PCB. Since a high percentage of the electronic circuit faults are produced by solder shorts between neighboring traces or terminal pins and incomplete solder joints between a terminal pin and a trace, manufacturing defect analyzers serve as an inexpensive means for detecting these faults. Therefore, manufacturing defect analyzers are able to fill a need for identifying simple defects on a printed circuit board without employing expensive in-circuit testing devices.

U.S. Pat. No. 5,280,237 discloses a manufacturing defect analyzer method for testing a semiconductor integrated circuit soldered onto a PCB. The method employs parasitic transistors which are present in ICs having diodes. The method includes applying a voltage across the terminal pins of the IC to be tested, measuring the resulting currents, connecting a transistor tester to selected terminal pins of the IC, and determining typical control of switching characteristics of a parasitic transistor (1T, 2T) of the semiconductor IC (IC1, IC2).

From a reading of U.S. Pat. No. 5,280,237, it is not substantially clear as to whether all the terminal pins of an IC can be checked. However, it is substantially clear that the disclosed method can only identify open circuits and that it is not able to detect the presence of short circuits between IC terminal pins.

Built-in self-test programs are designed into the functions of the electronic circuit to analyze the electronic circuit and note whether an improper signal is provided as a result of the application of a specific signal. Such self-test programs have significant drawbacks. First, the programs usually take a relatively long time to complete their analysis. Secondly, the self-test programs require at least a few "good" connections (i.e., address/data buses) in order to perform a proper analysis of the electronic circuit. Thirdly, the built-in self test programs increase the cost of each electronic circuit because the built-in self test must be contained in each electronic circuit. Typically, the end user of the electronic circuit is unwilling to pay for such a silicon intensive built-in test circuit.

OBJECTS AND SUMMARY OF THE INVENTION

It is therefore an object of the present invention to provide apparatus and method for testing the electrical connection between a terminal pin of an integrated circuit and a corresponding trace of a printed circuit board.

It is another object of the present invention to provide apparatus and method for testing the electrical connection between a terminal pin of an integrated circuit and a corresponding trace of a printed circuit board in a way that does not rely on knowledge of the normal intended operation of the circuit.

It is a further object of the present invention to provide apparatus and method for testing the connection between an integrated circuit and a printed circuit board which can detect both open circuits and short circuits.

It is yet another object of the present invention to provide apparatus and method for testing the connection between an integrated circuit and a printed circuit board which can quickly identify soldering problems so that the printed circuit board can be repaired.

It is still another object of the present invention to provide apparatus and method for testing the connection between an integrated circuit and a printed circuit board in a way which overcomes inherent disadvantages of known apparatus and methods.

In accordance with one form of the present invention, a method of testing an electrical interconnection between an integrated circuit having internal circuitry and a plurality of input/output (I/O) pins, and a printed circuit board having a plurality of traces respectively connected to the plurality of I/O pins includes setting a high threshold voltage level (HTVL) and setting a low threshold voltage level (LTVL). The method also includes coupling a voltage source to the plurality of I/O pins through a respective first impedance. The voltage source provides a source voltage level. A second impedance is electrically coupled between a first trace of the plurality of traces and a voltage potential (e.g., ground). Thereafter, a measured voltage level on the first trace is compared with the HTVL and LTVL to determine whether the electrical interconnection is proper.

In another embodiment, the measured voltage level on the first trace is compared with HTVL and LTVL to determine whether the measured voltage level is less than LTVL, between LTVL and HTVL, or greater than HTVL. If the measured voltage level on the first trace is below LTVL, then a determination is made that an open circuit is present between the first trace and a respective I/O pin. However, if the measured voltage level on the first trace is above HTVL, then a determination is made that a short circuit is present between the I/O pin corresponding to the first trace and another I/O pin of the plurality of I/O pins. If the measured voltage level on the first trace is between LTVL and HTVL, then a determination is made as to whether there is a short circuit between at least two I/O pins of the integrated circuit. This is performed by determining whether a voltage level on each of the plurality of traces other than the first trace is above HTVL. If the voltage level on at least one of the plurality of traces other then the first trace is above HTVL, then the first trace is properly electrically coupled to a respective I/O pin. However, if the voltage level on at least one of the plurality of traces other than the first trace is below HTVL, then a determination is made that there is a short circuit between the I/O pin corresponding to the first trace and another I/O pin of the plurality of I/O pins.

Another aspect of the present invention is directed to a method of testing an electrical interconnection between an integrated circuit having internal circuitry and a plurality of input/output (I/O) pins, and a printed circuit board having a plurality of traces respectively connected to the plurality of I/O pins. The method includes setting a high threshold voltage level (HTVL) and coupling a voltage source to the plurality of I/O pins through respective first impedances wherein the voltage source provides a source voltage level. The method also includes electrically coupling a second impedance between a first trace of the plurality of traces and a voltage potential, and detecting a short circuit between the I/O pin corresponding to the first trace and at least one other of the plurality of I/O pins by comparing a measured voltage level on the first trace with HTVL.

Another aspect of the present invention is directed to apparatus for testing an electrical interconnection between an integrated circuit having internal circuitry and a plurality of input/output (I/O) pins, and a printed circuit board having a plurality of traces adapted to be respectively connected to the plurality of I/O pins. The apparatus includes a first comparator having first and second input ports and an output port. The first input port is coupled to a first source of a first threshold level. The apparatus also includes a second comparator having first and second input ports and an output port wherein the first input port of the second comparator is electrically coupled to the second input port of the first comparator. The first input port of the second comparator and the second input port of the first comparator are adapted to be connected to a corresponding trace of the printed circuit board. The second input port of the second comparator is coupled to a second source of a second threshold level. The apparatus also includes a first impedance having a first port electrically coupled to the second input port of the first comparator. A switching element is electrically coupled between the second port of the first impedance and a voltage potential. The switching element selectively couples the first resistor to the voltage potential. The switching element may be a transistor which is selectively turned on and off by a biasing voltage.

Another aspect of the present invention is directed to an integrated circuit. The integrated circuit includes a plurality of input/output (I/O) pins and resistive elements operatively selectively coupling the plurality of I/O pins, respectively, to a voltage source. The integrated circuit also includes a test line coupled to the resistive element and internal circuitry having at least an input port and an output port connected to the plurality of I/O pins.

In another embodiment of the invention, the integrated circuit also includes an I/O buffer cell electrically coupled to the test line wherein when a predetermined voltage is provided on the test line, the output port of the internal circuitry is substantially electrically decoupled by the I/O buffer cell from a respective I/O pin and the voltage source is electrically coupled to the respective I/O pin.

Another aspect of the present invention is directed to an electronic circuit including a printed circuit board having a plurality of traces and an integrated circuit. The integrated circuit includes a plurality of input/output (I/O) pins respectively soldered to the plurality of traces and a resistive element operatively selectively coupling one of the plurality of I/O pins, respectively, to a voltage source. The integrated circuit also includes a test line operatively coupled to the resistive elements, internal circuitry having a plurality of output ports and an I/O buffer cell between the output ports of said internal circuitry and said I/O pins, respectively. A control input is electrically coupled to the internal circuitry and to the test line. When a predetermined voltage is provided on the test line, the output ports of the internal circuitry are substantially electrically decoupled by said I/O buffer cells from a respective I/O pin and the voltage source is electrically coupled to the plurality of I/O pins.

A preferred form of the method and apparatus for testing the connections between an integrated circuit and a printed circuit board, as well as other embodiments, objects, features and advantages of this invention, will be apparent from the following detailed description of illustrative embodiments thereof, which is to be read in connection with the accompanying drawings.

DETAILED DESCRIPTION OF THE PREFERRED EMBODIMENTS

Figure 1:
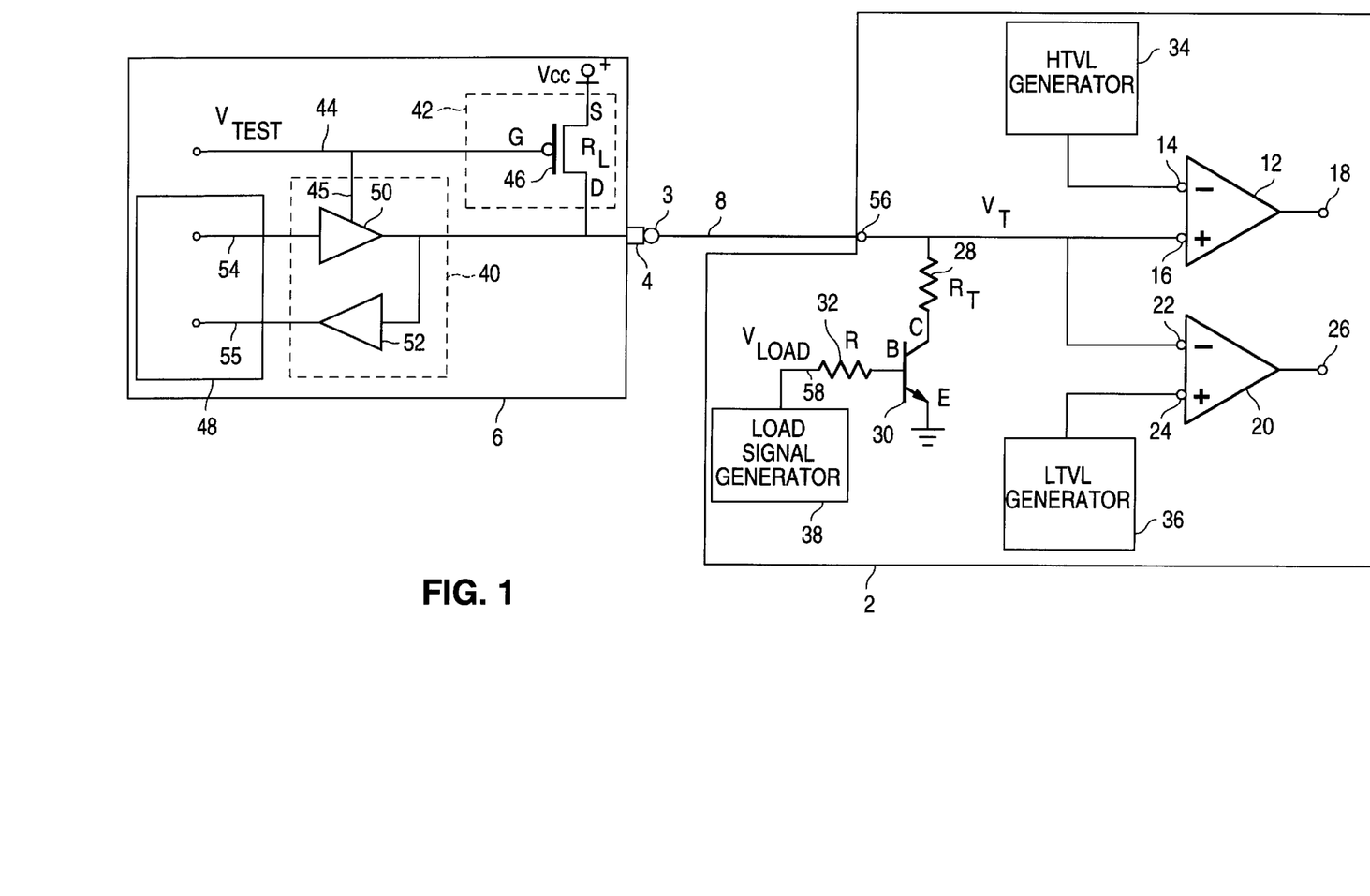
FIG. 1 is a functional block diagram of a tester circuit electrically coupled to terminal pins of an integrated circuit via a conductive trace of a printed circuit board and a solder joint.

Referring now to the drawings, a tester circuit 2 for testing the interconnection 3 (i.e., solder joint) between an input/output terminal pin 4 (hereinafter "I/O pin") of an integrated circuit ("IC") 6 and a conductive trace 8 (see FIG. 3) of a printed circuit board ("PCB") 10 is shown. For simplicity, only one I/O pin 4 is shown in FIG. 1. However, as known in the art, each IC may include numerous I/O pins 4 (as shown in FIG. 3 and FIGS. 4A–D).

The tester circuit 2 has a first comparator 12 with a first input port 14 (inverting input) and a second input port 16 (non-inverting input). The second input port is electrically connected to port 56 of the tester circuit. The first comparator 12 has an output port 18 for providing an output signal if a voltage present at the second input port 16 is greater than the voltage present at the first input port 14. The tester circuit 2 has a second comparator 20 with a first input port 22 (inverting input) electrically coupled to port 56. The second comparator 20 also has a second input port 24 (non-inverting input) and an output port 26 for providing an output signal if the voltage present at the first input port 22 is below the voltage present at the second input port 24. The first and second comparators preferably have a high impedance load (typically FET). A suitable comparator for use as components 12 and 20 of the present invention is Part No. LF311 manufactured by National Semiconductor Corp. of Santa Clara, Calif.

The tester circuit 2 has a first resistor, or test resistor, ($R_T$) 28. While a resistor is shown in the drawings and described, it is foreseen that other devices which provide an impedance may be utilized. A first terminal lead of the first resistor 28 is electrically coupled to port 56. A second terminal lead of the first resistor is electrically coupled to a transistor 30. The transistor 30 is preferably an npn bi-polar junction transistor (BJT). The transistor 30 acts as a switch which is selectably closed and opened (i.e., the transistor is off/on) during particular phases of testing, as will be described in detail below. The second terminal lead of the first resistor 28 is coupled to a collector (C) of the transistor 30 as shown in FIG. 1. The transistor 30 also has a base (B) and an emitter (E). The emitter of the transistor is electrically coupled to a ground potential, while a second resistor (R) 32 is electrically coupled to the base (B) of the transistor. The second resistor 32 is a current limiting resistor and its value is selected based upon the desired current-voltage (I-V) characteristics of the particular transistor 30 being used.

The first input port 14 of the first comparator 12 is preferably provided with a voltage (corresponding to a high threshold voltage level-HTVL) with which a voltage ($V_T$) present at port 56 is compared (described below). In the preferred embodiment, the HTVL is set to 4.0 volts by a high threshold voltage level generator 34 (if $V_{CC}$, as described below, is set to approximately 5.0 volts). If the voltage ($V_T$) is above the HTVL, an output signal is provided at the first comparator output port 18. In a similar manner, a voltage (corresponding to a low threshold voltage level-LTVL) is provided by a low threshold voltage level generator 36 at the second input port 24 of the second comparator 20. In the preferred embodiment, the LTVL is set to 1.0 volts (if $V_{CC}$, as described below, is set to approximately 5.0 volts). The voltage ($V_T$) present at port 56 is compared with the LTVL. If the voltage $V_T$ is less than the LTVL, an output signal is provided at the second comparator output port 26.

The HTVL generator 34 and LTVL generator 36 can be any means for providing a voltage such as a variable voltage or current source in combination with a variable impedance. Obviously, a fixed voltage or current supply and impedance is also suitable.

As shown in FIG. 1, the second resistor 32 is preferably coupled between the base of transistor 30 and a load signal generator 38. The value of resistor 32 is selected such that when a particular voltage ($V_{LOAD}$) is provided by load signal generator 38, the transistor will turn on and the first resistor 28 will be electrically coupled (i.e., it is in circuit) through transistor 30 to ground (described below). In the preferred embodiment, the voltage level of $V_{LOAD}$ required to turn on transistor 30 is substantially equivalent to a logic "1" (i.e., approximately 5 volts). When $V_{LOAD}$ provided by load signal generator 38 is at a logic "0" which is a particular voltage less than logic "1" (i.e., substantially zero volts), the transistor 30 turns off (i.e., the transistor becomes the substantial equivalent to an open circuit) and the first resistor 28 is not electrically coupled to ground.

Figure 3:
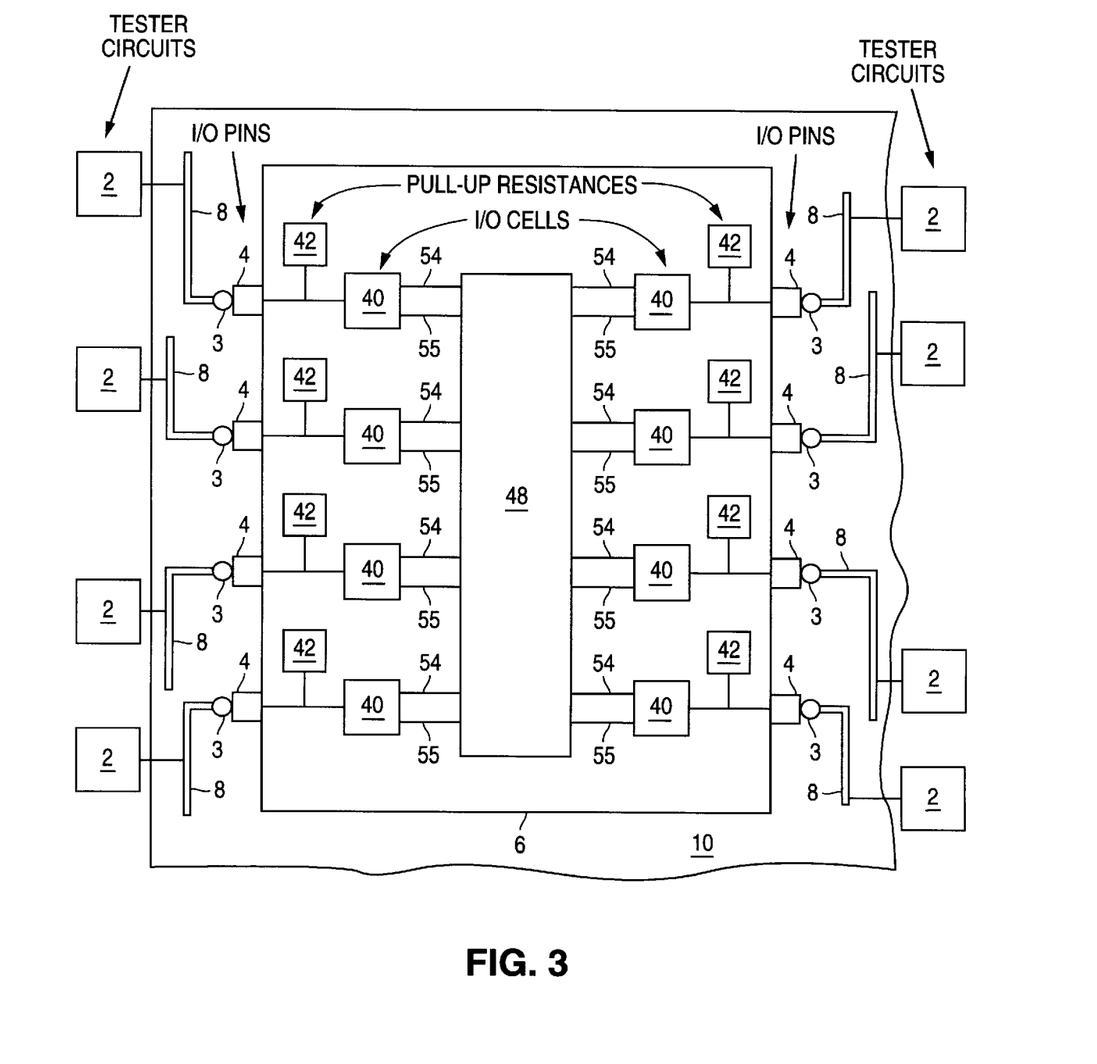
FIG. 3 is a functional block diagram of one integrated circuit coupled to a printed circuit board, and tester circuits coupled to the conductive traces of the printed circuit board, respectively.

As shown in FIG. 1, port 56 of tester circuit 2 is electrically coupled to conductive trace 8 which is associated with the I/O terminal pin 4 of the IC under test. As shown in FIG. 3, a separate tester circuit 2 is electrically coupled to each conductive trace 8 to which the IC under test is associated. Port 56 is preferably coupled to trace 8 by an automatic test equipment (ATE) machine which has a test head designed with test pins positioned to engage traces 8 in a well known manner.

Referring again to FIGS. 1 and 3, a functional block diagram showing the equivalent relevant circuits inside integrated circuit 6 is shown. An aspect of the present invention includes modifying the internal electronic circuit design of each integrated circuit to include an active pull-up resistance, or load resistor, ($R_L$) 42 for each I/O pin 4. Integrated circuits typically have an input/output buffer cell or an input buffer, or an output buffer 40 for each I/O pin 4. While an active pull up resistance is shown in the drawings and described, it is foreseen that other devices which provide an impedance may be utilized.

The integrated circuit 6 has a plurality of I/O pins 4. Electrically coupled to each I/O pin 4 is an active pull-up resistance ($R_L$) 42. The active pull-up resistance 42 is also coupled to a voltage source ($V_{CC}$) and a test line 44 (described below). For simplicity, the voltage source ($V_{CC}$) and test line 44 are not shown in FIG. 3. The voltage source $V_{CC}$ preferably provides a voltage in the range of 4.5 to 5.5 volts. In a preferred embodiment, the active pull-up resistance 42 is a transistor 46 designed to provide a low output impedance without a high power consumption. The transistor 46 is preferably a field effect transistor (FET) wherein the source (S) is coupled to voltage source $V_{CC}$, the drain (D) is operatively coupled to the I/O pin 4, and the gate (G) is coupled to test line 44. As was described in connection with transistor 30, the transistor 46 functions as a switch which selectively couples voltage source $V_{CC}$ to I/O pin 4 (i.e., in circuit) when an appropriate biasing voltage ($V_{TEST}$) is provided on test line 44 to turn on transistor 46 (described below). However, unlike transistor 30 which acts like a short circuit when "on", transistor 46 has a relatively high resistance when "on".

Also electrically coupled to the I/O pin 4 is input/output (I/O) cell 40. The I/O cell 40 functions as a buffer for signals being provided between the I/O pin 4 and the internal (e.g. computational) circuitry 48 of the IC. The I/O cell 40 preferably includes first and second amplifiers 50, 52. The first amplifier 50 has its input port coupled to an output line 54 of internal circuitry 48. The output port of the first amplifier is coupled to the I/O pin 4. The first amplifier also includes a control input coupled via control line 45 to the test line 44 (described below) for disabling (i.e., floating) the associated output line 54 of the internal circuitry 48 so that circuitry 48 is not connected to I/O pin 4. As a result, any signal present on the output line 54 will not be provided to I/O pin 4. Since the internal circuitry 48 is isolated from the I/O pin 4 during testing by tester circuit 2, it is not necessary with the present invention to know the normal intended operation of the IC. The second amplifier 52 of the I/O cell 40 has its input port coupled to the I/O pin 4 and its output port coupled to an input line 55 of the internal circuitry 48. Internal circuitry 48 of the IC is a high impedance load (typically CMOS) and, therefore, it does not significantly affect the testing operation which is described in detail below.

As stated above, test line 44 is operatively coupled to first amplifier 50 and to transistor 46. The test line 44 is an internal line of the IC 6 that controls the activation of a test mode. The test line 44 is preferably coupled to a test signal generator (not shown) which may be part of an automatic test equipment (ATE) machine for providing a voltage ($V_{TEST}$) on test line 44. The IC may not have a test line 44 coupled to the I/0 buffer 40 to selectively prevent an output signal from being provided to I/O pin 4. If test line 44 is not present, then the internal electronic circuit design should be modified to add this internal control line as shown in FIG. 1. Also, some IC's use an amplifier such as amplifier 50 with a control input and control line for various purposes. If, however, a particular IC design does not include such features, they should preferably be added to the design for purposes of the present invention.

When the voltage ($V_{TEST}$) provided by the test signal generator is at a predetermined biasing voltage, the transistor 46 which comprises the active pull-up resistance 42 turns on. As a result, the voltage source $V_{CC}$ is now connected via the active pull-up resistance 42 to the I/O pin 4. The voltage provided by the test signal generator also serves to disable the first amplifier 50 so as to float output line 54. The effect of internal circuitry 48 via second amplifier 52 is insubstantial, as stated above, and is not taken into account in the ensuing description. As a result, only the voltage generated by voltage source $V_{CC}$ will influence the voltage present at I/0 pin 4. The test line 44 may be driven by one of the plurality of I/O pins of the IC. If the test line 44 is driven by an I/O pin, then one pin of the IC must be specifically dedicated to this function. Alternatively, a specific combination of input signals on a group of I/O pins which are not otherwise used can be indicative of a test mode to activate the test signal generator.

In order to effectuate the method of the present invention, port 56 of the tester circuit 2 is operably coupled to a conductive trace 8 of PCB 10 by solder 3 as shown in FIGS. 1 and 3. While one test circuit 2 is shown in FIG. 1, the present invention is preferably effectuated by coupling one tester circuit to each PCB trace 8 to which the I/O pin 4 is connected, as shown in FIGS. 3 and 4A–C, so that functions of the method can be executed concurrently.

In an alternative embodiment of the invention, only one tester circuit is used with a plurality of analog switches (not shown). As a result, when a comparison between voltage $V_T$ and the HTVL and LTVL need be performed for a specific trace, the corresponding analog switch is activated to couple the tester circuit to the corresponding trace. In this alternative embodiment, all of the traces are necessarily tested in a sequential manner. While this configuration is likely to be less expensive to implement than the preferred embodiment, it results in a longer testing period because of the sequential testing.

In order to accomplish the aforementioned objects, the present invention includes two specific tests which enable an evaluation of the interconnection between the I/O pins 4 of an IC 6 and the corresponding traces 8 of a PCB 10. TEST #1 (represented by FIGS. 5A, 5B and 5C) effectively determines whether the I/O pin under test is shorted to ground, or if an open circuit exists with respect to the I/O pin under test and the trace of the PCB, or if the I/O pin under test is shorted to another pin. TEST #2 (represented by FIG. 5D) effectively determines whether the I/O pin under test is shorted to another I/O pin. If the I/O pin under test passes each of TESTS 1 and 2, the I/O pin 4 is determined to be properly soldered to the corresponding trace of the PCB.

Figure 5A:
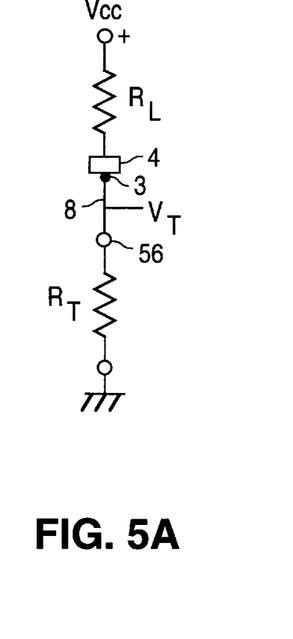
FIG. 5A is an equivalent circuit of the functional block diagram of the present invention when there is a proper electrical connection between the I/O pin under test and a corresponding PCB trace during TEST #1.
Figure 5B:
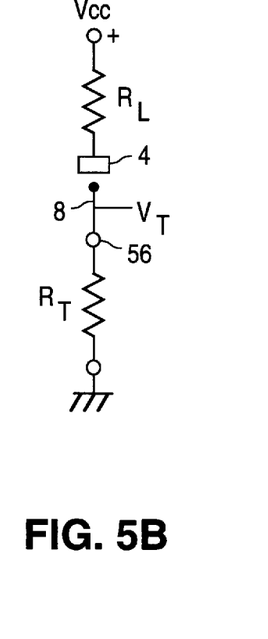
FIG. 5B is an equivalent circuit of the functional block diagram of the present invention when there is an open circuit between the I/O pin under test and a corresponding PCB trace during TEST #1.
Figure 5C:
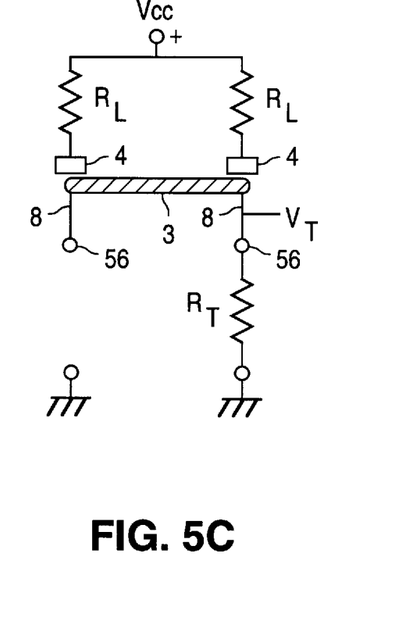
FIG. 5C is an equivalent circuit of the functional block diagram of the present invention when there is a short circuit connection between the I/O pin under test and another I/O pin during TEST #1.

Referring now to FIGS. 5A, 5B and 5C, equivalent circuits for FIG. 1 during TEST #1 are shown for three possible circuit conditions. Specifically, FIG. 5A shows the effective equivalent circuit representation and expected voltage $V_T$ when the I/O pin 4 is "properly" electrically coupled to the PCB trace 8. FIG. 5B shows the equivalent circuit and expected voltage $V_T$ if an open circuit exists between the I/O pin and the trace (or if the trace is shorted to a ground potential). FIG. 5C shows the equivalent circuit representation and expected voltage $V_T$ when there is a short circuit between the I/0 pin under test and at least one other I/O pin.

According to TEST #1, a voltage $V_{TEST}$ is provided on test line 44 to bias transistor 46 "on" for all of the I/O pins and a load signal $V_{LOAD}$ is provided on load line 58 to bias transistor 30 "off" for all of the I/O pins except for the I/O pin under test which has its transistor 30 biased "on" by $V_{LOAD}$.

If there is a "proper" solder connection between the I/O pin under test and the trace 8 as shown in FIG. 5A, then the voltage $V_T$ measured at port 56 should be between LTVL and HTVL because of the voltage drops across $R_L$ and $R_T$. For example, if $R_L$=50K ohms, $R_T$=100K ohms and $V_{CC}$= 5.5 volts, then $V_T$=100/150×5.5v =3.67v. If LTVL is set to 1.0 volt and HTVL is set at 4.0 volts, then using the assumed values, a proper connection would be detected by TEST #1.

If the I/O pin is not properly soldered to the trace of the printed circuit board (or shorted to ground) as shown in FIG. 5B, then no current will flow from $V_{CC}$ through resistors $R_L$ and $R_T$ to ground because of the open circuit. Therefore, the voltage $V_T$ measured at port 56 will have no relation to $V_{CC}$. Since port 56 is coupled to a ground potential through resistor $R_T$, voltage $V_T$ should be approximately zero volts which is less than LTVL.

If, in connection with TEST #1 there is a short circuit between the I/O pin under test and another I/O pin as shown in FIG. 5C, and assuming that $R_L$=50K ohms, $R_T$=100K ohms and $V_{CC}$=5.5 volts, then the equivalent resistance ($R_P$) of having two resistors ($R_L$) in parallel is equal to:

$$R_P = R_L/2 = 25K \text{ ohms}$$

and the voltage $$V_T = V_{cc} \times \frac{R_T}{R_T + R_P} = 5.5 \text{ volts} \times \frac{100}{125} = 4.4 \text{ volts}$$

which is above the HTVL of 4.0 volts. Such a value for HTVL can only occur in TEST #1 if there is a short between the I/O pin under test and at least one other pin. Otherwise, i.e. if there is no short, $$V_T = \frac{100}{125} \times 5.5 = 3.67,$$

as explained above for FIG. 5A.

One advantage of the present invention is that it operates over a wide range of values for $R_L$, namely 4:1. Thus, it will yield a fault indication even for an $R_L$ value of 200K ohm. However, the equivalent circuit of FIG. 5C for this value of $R_L$ results in $R_P$=100K ohm. Therefore $$V = \frac{100}{100 + 100} \times 5.5v = 2.75v.$$

Because this is not above HTVL, TEST #1 fails to yield a fault indication despite the existence of a short. Consequently, a second test is provided.

Figure 5D:
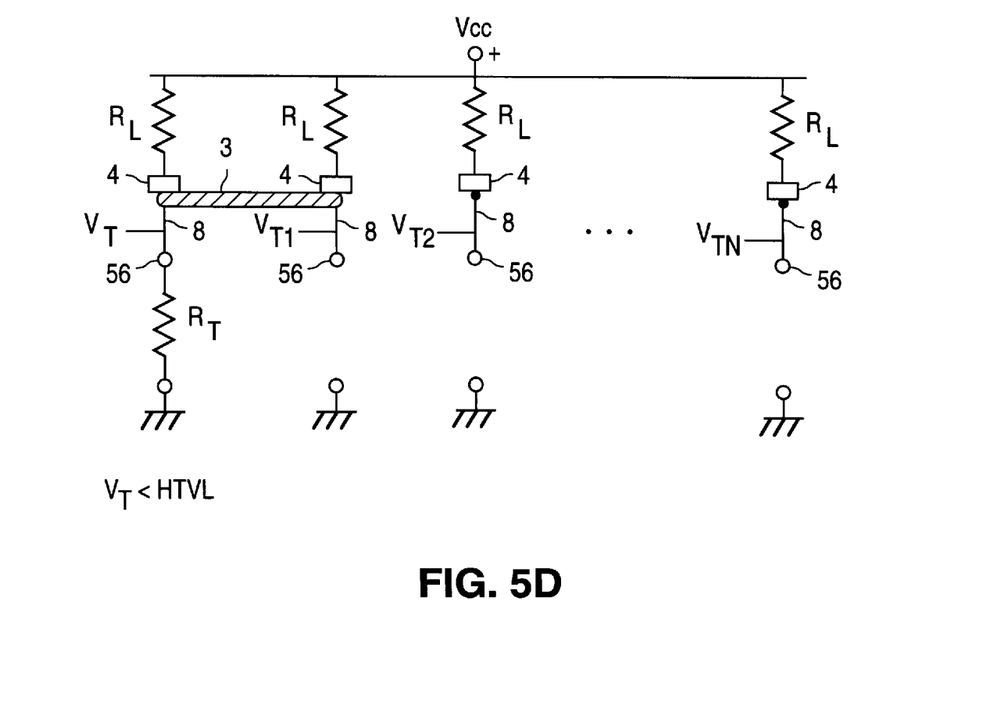
FIG. 5D is an equivalent circuit of the functional block diagram of the present invention for a short circuit connection between the I/O pin under test and at least one other I/O pin during TEST #2.

Referring to FIG. 5D, an equivalent circuit for FIG. 1 is shown wherein a biasing voltage $V_{TEST}$ is provided on all I/O pins and a biasing voltage $V_{LOAD}$ to turn "on" transistor 30 is provided on the I/O pin under test. TEST #2 determines whether the voltage corresponding to an I/O pin other than the I/O pin under test is below HTVL. If the voltage $V_T$ corresponding to another I/O pin is below HTVL, this indicates that the I/O pin under test is shorted to the I/O pin having the voltage below HTVL. This is shown by the following wherein $V_{CC}$=5.5 volts, $R_T$=100K ohms and $R_L$=200K ohms. If there is a short circuit between two I/O pins, then current will flow through each of resistors $R_L$ that are connected in parallel. Therefore, there will be a voltage drop across resistor $R_L$ of the I/O pin which is not under test where a voltage drop should not be present. This is because current flows to ground potential from $V_{CC}$ through each of the parallel resistors $R_L$ through $R_T$ of the I/O pin under test. More specifically, $V_{T1}$ of the other I/O pin is 2.75v, as explained above, which is below HTVL whereas it is expected to be above HTVL under no-fault conditions. Therefore, if $V_T$ of the I/O pin which is not under test is less than HTVL, a short circuit is detected between the I/O pin under test and the other I/O pin.

The above values were used for purposes of explanation. It is foreseen that $V_{CC}$ may vary between 4.5 and 5.5 volts, and that $R_L$ may vary between 50 and 200K ohms.

Figure 2:
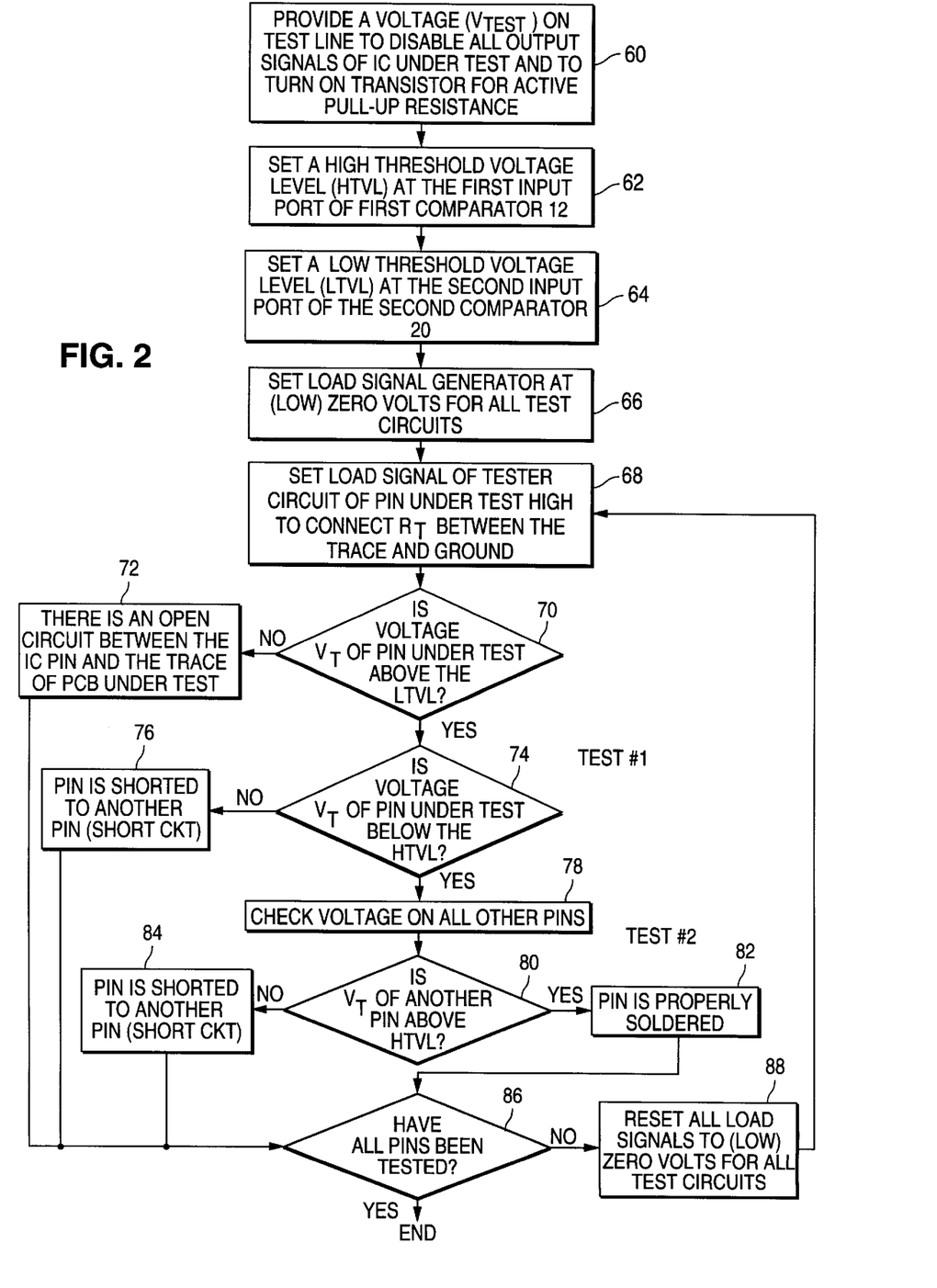
FIG. 2 is a flow chart of the method of the present invention.

Referring now to FIG. 2 of the drawings, the method for testing the interconnection of an I/O pin 4 of an integrated circuit 6 and a conductive trace 8 of a printed circuit board 10 via a solder joint 3 in accordance with the present invention will be described. While the following description determines the sufficiency of the connection of one integrated circuit, the method is preferably replicated for each IC present on the PCB.

Figure 4A:
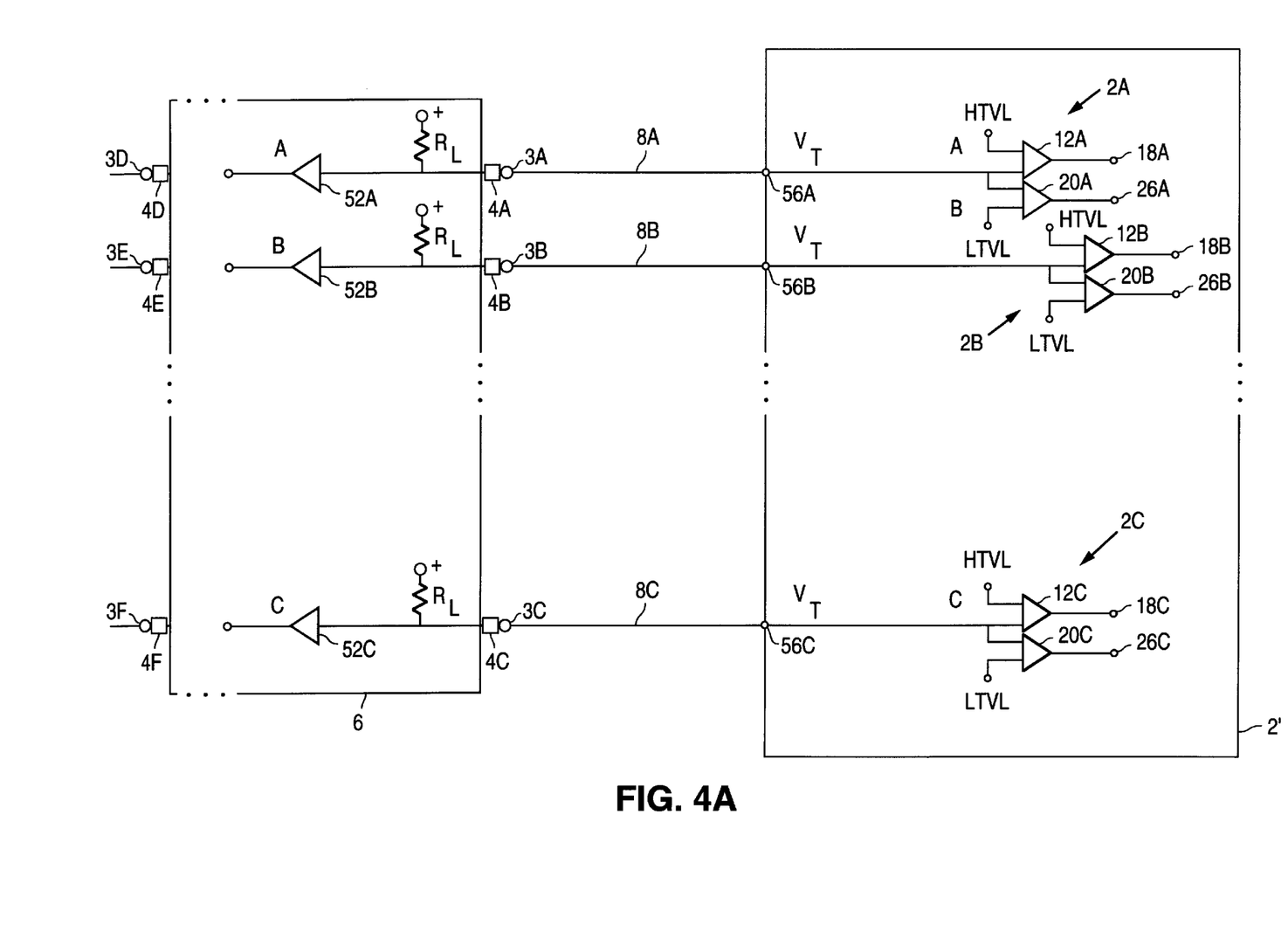
FIG. 4A is an equivalent circuit of the functional block diagram of the present invention when the signal $V_{LOAD}$ provided by the load signal generator of FIG. 1 for tester circuits A, B . . . C is such that test resistor $R_T$ is not in circuit while the signal $V_{TEST}$ for I/O pins corresponding to tester circuits A, B . . . C is such that load resistor $R_L$ is in circuit.

The method begins by providing a biasing voltage ($V_{TEST}$) on test line 44 which is sufficient to turn on transistor 46 to electrically couple voltage source $V_{CC}$ to I/O pin 4 under test (Step 60). In the preferred embodiment, the same biasing voltage is concurrently provided for each test line 44 associated with a respective I/O pin 4. The voltage on test line 44 also simultaneously disables amplifier 50 such that output line 54 is floated (i.e., not coupled to I/O pin 4) (Step 60). The equivalent circuit within the IC provided as a result of the presence of $V_{TEST}$ on test line 44 is shown in FIG. 4A (showing three I/O pins (4A, 4B and 4C) and associated test circuitry (2A, 2B and 2C). The test circuitry for I/O pins 4D, 4E and 4F is not shown so as to not unduly clutter the drawings.

A high threshold voltage level (HTVL) is provided at the first input port 14 of each first comparator 12 by HTVL generator 34 (Step 62). In the preferred embodiment, the HTVL is set at approximately 4.0 volts for a $V_{CC}$ of 4.5 volts to 5.5 volts and for other circuit component values described below. However, other voltage levels can be selected depending upon the specific circuit parameters (i.e., resistance values for $R_L$ and $R_T$ and the selected voltage level of $V_{CC}$).

In a manner similar to setting the HTVL, a low threshold voltage level (LTVL) is set at the second input port 24 of each second comparator 20 (Step 64). In the preferred embodiment of the invention, the LTVL is set at 1.0 volt. However, the LTVL can be set to other voltage levels depending upon specific circuit parameters (i.e., resistance values for $R_L$ and $R_T$ and the selected voltage level of $V_{CC}$). As a result of setting the high and low threshold voltage levels, a determination can be made whether a voltage $V_T$ present on the PCB trace (i.e., at port 56 of the test circuit) associated with each I/O pin 4 is above the HTVL, below the LTVL or between the HTVL and the LTVL when transistor 46 associated with each I/O pin 4 is turned on and when transistor 30 is either turned on or off.

As mentioned previously and as shown in FIG. 4A, separate tester circuits 2A, 2B and 2C are coupled to each trace 8 to which a corresponding I/O pin 4A, 4B and 4C is coupled. The tester circuits may be contained together in a composite tester circuit 2' as shown in FIG. 4A.

As shown in FIG. 1, port 56 of tester circuit 2 is connected to a corresponding PCB trace 8. The load signal generator 38 initially provides a low voltage level, corresponding to a logic "0" on the load line 58 of each tester circuit 2 (Step 66). By providing a low voltage level on each load line 58, each transistor 30 will not turn on because the required biasing voltage is not present. Therefore, each transistor 30 appears as an open circuit and there is no current flow through first resistor 28 ($R_T$) from voltage source $V_{CC}$. The equivalent circuit within the tester circuit provided as a result of a logic "0" biasing voltage on load line 58 is shown in FIG. 4A.

Figure 4B:
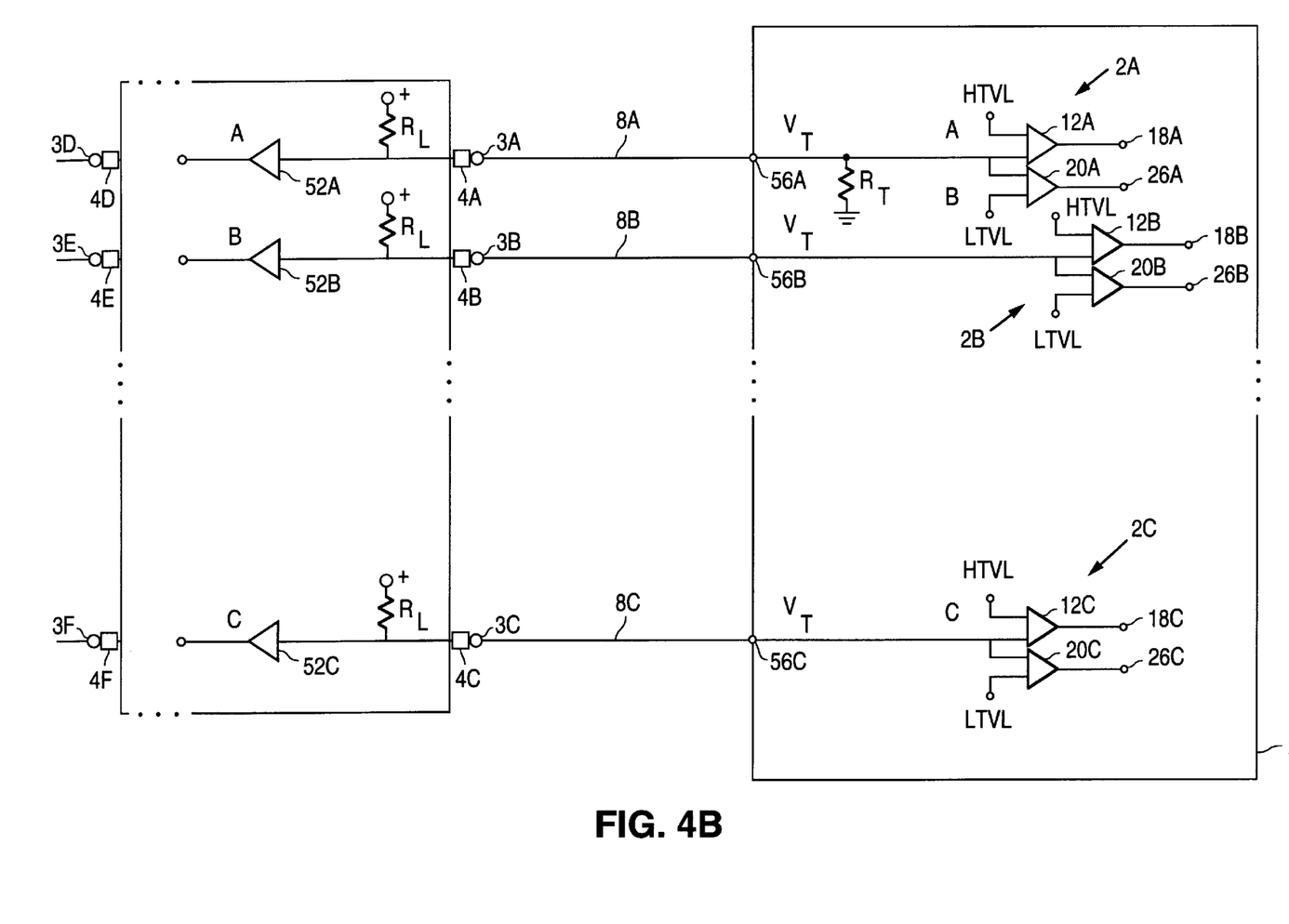
FIG. 4B is an equivalent circuit of the functional block diagram of the present invention when the signal $V_{LOAD}$ provided by the load signal generator of tester circuits B . . . C is such that a test resistor $R_T$ is not in circuit while $R_T$ of tester circuit A is in circuit, and the signal $V_{TEST}$ for I/O pins corresponding to tester circuits A, B . . . C is such that load resistor $R_L$ is in circuit.
Figure 4C:
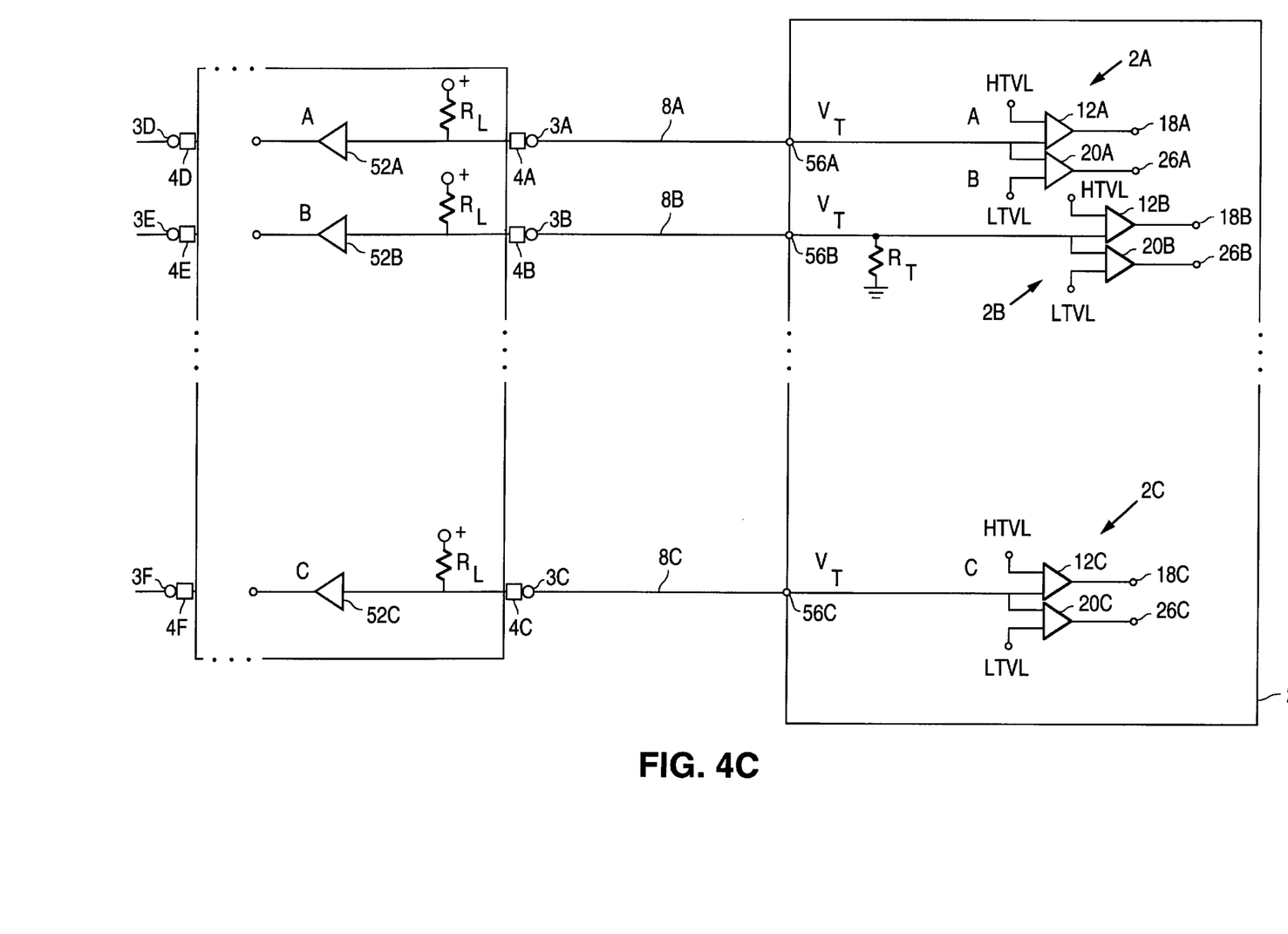
FIG. 4C is an equivalent circuit of the functional block diagram of the present invention when the signal $V_{LOAD}$ provided by the load signal generator of tester circuits A . . . C, other than B, is such that test resistor $R_T$ is not in circuit while $R_T$ of tester circuit B is in circuit, and the signal $V_{TEST}$ for I/O pins corresponding to tester circuits A, B . . . C is such that load resistor $R_L$ is in circuit.

The load signal generator 38 associated with the I/O pin under test then provides a required biasing signal to transistor 30 to forward bias the transistor and couple first resistor 28 ($R_T$) between port 56 and ground (Step 68). The resulting equivalent circuit provided as a result of Step 68 is shown in FIG. 4B.

The load lines 58 of the remaining tester circuits (B . . . C) remain at a low logic level (i.e., the high voltage level is provided on load line 58 for only one tester circuit at a time). The logic "1" on load line 58 associated with I/O pin 4 of tester circuit (A) provides a biasing voltage to turn on transistor 30 (which has a sufficiently low "on" resistance to be ignored in the ensuing description) so that the first resistive element 28 is coupled to the ground potential (Step 68). Therefore, a circuit is formed which includes $V_{CC}$, $R_L$ (the equivalent resistance of transistor 46), $R_T$, and ground as shown in FIG. 4B. The voltage level $V_T$ at port 56A of tester circuit 2A is monitored to determine via output 26A of comparator 20A whether $V_T$ is above the low threshold voltage level (Step 70). If $V_T$ is below the LTVL (NO in Step 70), then it is determined that the I/O pin 4A and the corresponding trace 8A are not properly soldered together (i.e., there is an open circuit) (Step 72). This is because for median circuit values of $V_{CC}$=5.0 volts, $R_T$=100K ohm, and an equivalent open circuit value for resistance of say, 10 Mohm, $$V_T = 5.0 \times \frac{100}{10100} = 0.05 \text{ volts},$$

which is clearly below the LTVL.

If $V_T$ at port 56A of tester circuit A is above the LTVL (YES in Step 70), then a determination is made as to whether $V_T$ at port 56A is below the HTVL (Step 74). If $V_T$ at port 56A is above HTVL (NO in Step 74), then the I/O pin 4A (under test) must be shorted to at least one other I/O pin of the integrated circuit (Step 82) which is not then under test. More specifically, as can be seen from FIG. 4B (and described above in relation to FIG. 5C), if I/O pin 4A of tester circuit A and I/O pin 4B of tester circuit B are shorted to each other, the effective resistance $R_P$ is formed by or $R_P$=$R_L$/2. Therefore, for $R_L$=50K ohm and $V_{CC}$=5.5V $$\frac{1}{R_P} = \frac{1}{R_L} + \frac{1}{R_L},$$

$$V_T = 5.5\text{V} \times \frac{R_T}{R_T + R_P} = 5.5v \times \frac{100}{100 + 25} = 4.4\text{V}.$$

Thus, Step 76 associates a condition of $V_T$>HTVL for TEST #1 with a short circuit. The pin to which the I/O pin under test is shorted is not specifically identified automatically. However, since soldering problems usually occur between neighboring I/O pins, a NO result in Step 74 provides an indication that the I/O pin under test is electrically shorted to at least one of its neighboring I/O pins. A manual inspection is required at this point to locate the short so that it can be repaired. Of course, if at the conclusion of testing only two pins are found to be shorted to another pin, it is deduced that they must be shorted to each other even without carrying out a manual inspection.

If $V_T$ at port 56A of tester circuit A (associated with the I/O pin under test) is below the HTVL (i.e., LTVL<$V_T$<HTVL; YES in Step 74), then the voltage levels $V_T$ (at ports 56B . . . 56C) associated with all other traces (associated with tester circuits B . . . C in FIG. 4B) are concurrently measured while transistor 30 of the I/O pin 4A under test remains on (Step 78). A determination is made as to whether $V_T$ at ports 56B . . . 56C is above HTVL (Step 80). If all of the measured voltages $V_T$ at ports 56B . . . 56C are above the HTVL (YES in Step 80), then it is determined that the I/O pin 4A is properly soldered via solder 3A to trace 8A (Step 88). If at least one of the measured voltages $V_T$ at ports 56B . . . 56C is below the HTVL (NO in Step 80), then the I/O pin 4A under test is determined to be shorted to each of the I/O pin(s) having a voltage below the HTVL (Step 84). Thus, Step 84 not only determines that the pin under test is shorted to another pin, but also automatically identifies the other pin(s) so that repairs can be made.

After steps 72, 76, 84 wherein it is determined whether there is an open circuit (or short to ground), or short circuit between I/O pins, a determination is made as to whether all of the I/O pins (I/O pin 4A, 4B . . . 4C) have been tested (Step 86). If all of the I/O pins have not been tested (NO in Step 86), then the respective load voltages ($V_{LOAD}$) provided on each load line 58 are reset to low (logic "0") (Step 88). Thereafter the method returns to Step 68 wherein the signal ($V_{LOAD}$) provided on load line 58 (associated with tester circuit B) is set to a logic "1" (See FIG. 4C) to connect its respective first resistive element 28 to ground (i.e., bias "on" transistor 30 of tester circuit B). The method then continues for pin 4B in the same manner as described above in connection with I/O pin 4A. After the I/O pin 4B has been tested (i.e., Steps 70–84 have been completed), and it is determined that all I/O pins have not been tested (NO in Step 86), the signal $V_{LOAD}$ provided on load line 58 of each tester circuit is reset to low (logic "0") (Step 88). The same equivalent circuit as in FIG. 4B is produced in sequence for testing the remaining I/O pins.

Once all of the I/O pins (i.e., 4A, 4B . . . 4C) have been tested (YES in Step 86), then the test of the particular IC has been completed and the results noted. Thereafter, the noted interconnection problems between the terminal I/O pins of the IC and traces of the PCB can be repaired (i.e., resoldered).

It has been discovered that it is rather difficult to provide an accurate resistance using the active pull-up devices coupled to each I/O pin of the IC. However, the present invention properly functions even if the active pull-up devices have very large fluctuations in resistance value.

Active resistors such as transistor 46 can have a wide effective range of resistance. This is caused by, for example, process deviations in manufacturing the device and temperature changes during operation. For the purposes of explanation, a deviation of 4:1 from the intended equivalent resistance value will be assumed. This assumed deviation in the equivalent resistance of the active pull-up resistance is substantially greater than the typical case which is usually in the range of 2:1–3:1. Therefore, for the purposes of explanation, assume that $R_L$, the equivalent active pull-up resistance, is between 50K ohm and 200K ohm, and assume that resistance $R_T$ for the resistor 28 of the tester circuit is 100K ohm.

If there are no short circuits or open circuits, when $R_T$ is connected (i.e., a biasing voltage is provided on the load line 58 to turn transistor 30 "on"), the voltage on the tested I/O pin (appearing at port 56) is:

$V_T = V_{CC} * R_T / (R_T + R_L)$

For $R_L$=50K ohm, $V_T = V_{CC} * 2/3$.

For $R_L$=200K ohm, $V_T = V_{CC} * 1/3$.

Assuming that $V_{CC}$ (the voltage source coupled to the active pull up resistor 42 of the IC) is in the range of 4.5 to 5.5 volts, $V_T$ can be between 4.5 * ⅓=1.5 volts and 5.5 * ⅔=3.67 volts.

If the high threshold voltage level (HTVL) is set to 4.0 volts, and the low threshold voltage level (LTVL) is set to 1.0 volt, it is substantially likely that when the I/O pin is properly soldered, the tester circuit will not provide a false indication of a bad connection.

It must also be demonstrated that even with the wide resistance variation of the active pull-up resistor, all actual interconnection problems (i.e., open and short circuits) are detected (i.e., no mis-detection).

Case 1: An open circuit can occur between the I/O pin 4 and the conductive trace 8 wherein the pin is not soldered and the resulting impedance of the load is infinite. In reality the impedance of the active pull-up resistor will be finite due to parasitic effects. If the resultant impedance is assumed to be 10 Mohm, when $R_T$ is coupled between the trace and ground, the voltage at port 56 will be $V_T = V_{CC} * 100/10100$. If $V_{CC}$=5.5 volts, $V_T$=0.05 volts. This measurement of $V_T$ is below the LTVL, as was the case with $V_{CC}$=4.5 volts, described above. Therefore, the failure will be detected throughout the expected range for $V_{CC}$.

Case 2: A short circuit can occur between at least two I/O pins. The equivalent resistance of the active pull-up resistor 46 is $R_P = R_L / n$, where n is the number of pins shorted together. The maximum equivalent resistance $R_P$ (active pull-up resistance) is assumed to be 100K ohm, i.e. when there is a short circuit between only two pins each having a resistance $R_L$ of 200K ohm each which is the maximum of the contemplated range. Since 100K ohm is within the range of expected resistance values $R_L$ for transistor 46, the short circuit failure will not be detected by Step 74 of the method. However, TEST #2 implemented by Steps 78, 80 and 84 will detect the fault. When all other I/O pins are checked in Step 78, there will be at least one pin where the voltage $V_T$ is below the HTVL ($V = V_{CC}/n$ indicating that a fault is present because n pins are connected together). If $R_L$ of the transistor 46 is smaller or n is larger, the equivalent $R_P$ becomes smaller. Therefore, $V_T$ will be above the HTVL if, for example, numerous pins are shorted together. For example, if $R_L$=50K ohm and n=5, the equivalent $R_P$=10K ohm, and $V_T = V_{CC} * 100/110$. For $V_{CC}$=4.5 volts, $V_T$=4.1 volts, which is above the HTVL (4.0 volts). In that situation Step 74 will yield a NO and the fault will be thusly detected. Obviously for $V_{CC}$=5.5 volts, the fault will also be detected. Thus, as has been shown above, a short circuit of one or more I/O pins may sometimes yield a $V_T$>HTVL and sometimes a $V_T$<HTVL, depending on the component values, value of $V_{CC}$ and the number of shorted pins. Nevertheless, a short circuit will be detected by the present invention due to the provision of Steps 74 and 80.

It should be mentioned that the apparatus and method of the present invention is limited to I/O pins which are not loaded by an external resistive device. ICs having the following type of I/O pins cannot be tested by this method:

1. Output or Input/Output pins loaded by resistive type devices such as pull-up resistors or TTL logic. Testing of these pins require special provisions to disconnect the external resistive device.

2. Input pins that are constantly driven by another circuit on the same board. Testing of those pins requires special provisions to disable the driving circuit or to disconnect it from the device under test.

As a result of the present invention, it is clear that the interconnection of IC's and PCBs of electronic circuits can be easily tested and the detected interconnection problems can be fixed without substantial circuit analysis, even when the active pull-up resistance values within the IC vary.

Although illustrative embodiments of the present invention have been described herein with reference to the accompanying drawings, it is to be understood that the invention is not limited to those precise embodiments. Various changes and modifications may be effected therein by one with ordinary skill in the art. For example, transistor 30 and resistor 32 can be replaced by analog switches, an FET transistor, a relay, or other switching devices. Also, it is possible to connect transistor 46, i.e., the load resistor, to ground and transistor 30, i.e. the test transistor, to $V_{CC}$. Of course, some features of the testing would have to be commensurately modified. These and other such changes are intended to fall within the scope of the invention as defined by the following claims.

What is claimed is:

1. An integrated circuit comprising:

a plurality of input/output (I/O) pins;

resistive elements operatively selectably coupling said plurality of I/O pins, respectively, to a voltage source; and a test line operatively coupled to said resistive elements;

wherein when a predetermined voltage is provided on said test line, said voltage source is electrically coupled to said plurality of I/O pins, the integrated circuit further comprising:

internal circuit having a plurality of output ports, and

I/O buffer cells between the output ports of said internal circuitry and said I/O pins, respectively, and having a control input electrically coupled to the test line;

wherein when the predetermined voltage is provided on said test line, said output ports of said internal circuitry are substantially electrically decoupled by said I/O buffer cells from said respective I/O pins.

2. The integrated circuit as defined by claim 1, wherein said resistive element is an active pull-up resistance.

3. The integrated circuit as defined by claim 2 wherein the active pull-up resistance is a transistor.

4. An electronic circuit comprising:

a printed circuit board having a plurality of traces;

an integrated circuit comprising:

a plurality of input/output (I/O) pins respectively soldered to said plurality of traces;

resistive elements operatively selectably coupling said plurality of I/O pins, respectively, to a voltage source;

a test line operatively coupled to the resistive elements;

internal circuitry having a plurality of output ports; and

I/O buffer cells between the output ports of said internal circuitry and said I/O pins, respectively, and having a control input electrically coupled to said internal circuitry and to said test line;

wherein when a predetermined voltage is provided on said test line, said output ports of said internal circuitry are substantially electrically decoupled by said I/O buffer cells from said respective I/O pins and said voltage source is electrically coupled to said plurality of I/O pins.

5. The electronic circuit as defined by claim 4 further comprising a tester circuit electrically coupled to said plurality of traces.

6. The electronic circuit as defined by claim 5, the tester circuit comprising:

a. a first comparator having first and second input ports and an output port, said first input port being coupled to a first source of a first threshold level;

b. a second comparator having first and second input ports and an output port, the first input port of the second comparator being electrically coupled to said second input port of said first comparator and being adapted to be connected to the at least one of the plurality of traces, said second input port of the second comparator being coupled to a second source of a second threshold level;

c. a first impedance having a first port electrically coupled to said second input port of said first comparator, said first impedance having a second port; and     d. a switching element electrically coupled between said second port of said first impedance and a voltage potential for selectively coupling said first resistor to said voltage potential.

\* \* \* \* \*

UNITED STATES PATENT AND TRADEMARK OFFICE
CERTIFICATE OF CORRECTION

PATENT NO. : 5,818,251
DATED : October 6, 1998
INVENTOR(S) : AMOS INTRATER

It is certified that error appears in the above-identified patent and that said Letters Patent is hereby corrected as shown below:

In Col. 14, line 40, delete "circuit" and replace with --circuitry--.

In Col. 14, line 40, after "ports" delete "," and replace with --;--.

Signed and Sealed this

Nineteenth Day of January, 1999

Attest:

Attesting Officer

*Acting Commissioner of Patents and Trademarks*